(12) United States Patent
Ohoka

(10) Patent No.: US 6,538,291 B1
(45) Date of Patent: Mar. 25, 2003

(54) INPUT PROTECTION CIRCUIT

(75) Inventor: Tsukasa Ohoka, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/669,846

(22) Filed: Sep. 27, 2000

(30) Foreign Application Priority Data

Sep. 29, 1999 (JP) ............................................ 11-275529

(51) Int. Cl.$^7$ ........................ H01L 23/62; H01L 29/76
(52) U.S. Cl. ...................... 257/363; 257/356; 257/401
(58) Field of Search ............................... 257/355–363, 257/401, 408, 344

(56) References Cited

U.S. PATENT DOCUMENTS

| 5,449,939 A | * | 9/1995 | Horiguchi et al. | .......... 257/360 |
| 5,623,387 A | * | 4/1997 | Li et al. | ............... 257/355 |
| 5,932,914 A | * | 8/1999 | Horiguchi et al. | .......... 257/355 |

FOREIGN PATENT DOCUMENTS

| JP | 3-73569 | * | 3/1991 | ................ 257/355 |
| JP | 4-79265 | * | 3/1992 | ................ 257/355 |

* cited by examiner

*Primary Examiner*—Tom Thomas
*Assistant Examiner*—Ori Nadav
(74) *Attorney, Agent, or Firm*—McGinn & Gibb, PLLC

(57) ABSTRACT

An input protection circuit comprising a MOS transistor which has a P$^-$ type semiconductor layer provided with an N$^+$ type drain region of rectangular shape and a P$^+$ type backgate contact region surrounding the same, the P$^+$ type backgate contact region having the shape of a frame parallel to each side of the drain region. In the input protection circuit, negative-level static electricity applied to an electrode pad is discharged by means of a forward bias to the PN junction between the semiconductor layer and the drain region. Here, N$^-$ type diffusion layers of U shape are formed between the drain region and the backgate contact region in the semiconductor layer at a predetermined distance from the drain region, so as to surround the vicinities of both longitudinal ends of the drain region. Thereby, the current path through the forward-biased PN junction is partially increased in resistance to avoid local current concentration for improved breakdown voltage.

3 Claims, 3 Drawing Sheets

INPUT PROTECTION CIRCUIT

BACKGROUND OF THE INVENTION

1. Field of the Invention

The present invention relates to an input protection circuit comprising MOS transistors for use in a semiconductor integrated circuit.

2. Description of the Related Art

In a semiconductor integrated circuit, input protection circuits are used for the purpose of preventing an electrostatic breakdown. FIG. 1 is a circuit diagram showing an input protection circuit. This input protection circuit comprises a P-channel type MOS transistor 1 and an N-channel type transistor 2 connected in series. The source and gate of the P-channel type MOS transistor 1 are connected to a power supply terminal VDD in common. The source and gate of the N-channel type MOS transistor 2 are connected to a ground terminal GND in common. The serial connection point is connected to an input terminal, or an electrode pad 3, and also connected to an internal circuit (not shown) through other wiring 4.

FIG. 2 is a plan view showing the arrangement of source regions, a drain region, and electrodes in a MOS transistor which constitutes a conventional input protection circuit. FIG. 3 is a sectional view taken along the line A—A of FIG. 2. The reference numeral 5 represents a lightly-doped one conductivity type, or P⁻ type semiconductor layer; 6 a heavily-doped opposite conductivity type, or N⁺ type drain region; 7 N⁺ type source regions; 8 a heavily-doped one conductivity type, or P⁺ type backgate contact region; 9 gate electrodes; 10 an insulation film; 11 a drain electrode; and 12 a source electrode. In FIG. 2, the gate electrodes 9, the drain electrode 11, and the source electrode 12 are shown by double-dashed chain lines, and the insulation film 10 is omitted. The lower part of the MOS transistor is also omitted from FIG. 2. The omitted part has the same configuration as that of the shown part, and hence the MOS transistor is generally symmetrical in the vertical direction.

Turning now to layout patterns, as shown in FIG. 2, the heavily-doped opposite conductivity type or N⁺ type drain region 6 is arranged in a rectangular shape in the lightly-doped one conductivity type or P⁻ type semiconductor layer 5. The N⁺ type source regions 7 are arranged in rectangular shapes beside both longer sides of the drain region 6 at a predetermined distance from the same. The gate electrodes 9 are arranged between the drain region 6 and the source regions 7 so as to extend along the longer sides of the drain region 6. Moreover, the heavily-doped one conductivity type or P⁺ type backgate contact region 8 is arranged at a predetermined distance from the drain region 6. The backgate contact region 8 is shaped like a frame which is parallel to each side of the rectangular drain region 6, so as to surround the drain region 6, the gate electrodes 9, and the source regions 7.

As shown in FIG. 3, the insulation film 10 is formed over the P⁻ type semiconductor layer 5. The insulation film 10 is provided with contact windows which reach the drain region 6, the source regions 7, and the backgate contact region 8. The drain electrode 11 is arranged in a rectangular shape so as to make electric contact with a plurality of points on the drain region 6 through contact windows in the insulation film 10. The source electrode 12 is arranged in a frame shape so as to make electric contact with a plurality of points on the source regions 7 and backgate contact region 8 and with both longitudinal ends of the gate electrodes 9 through contact windows in the insulation film 10.

The drain electrode 11 is connected to an electrode pad (not shown), and the source electrode 12 is connected to a ground terminal GND (not shown).

The input protection circuit of FIG. 1, when a high voltage resulting from static electricity is applied to the electrode pad 3 while the ground terminal GND is grounded and the power is not yet turned on, discharges the electrostatic charge to the ground terminal GND through the N-channel type MOS transistor 2. As shown in FIGS. 1 and 2, if the static electricity applied to the electrode pad is of negative voltage, the PN junction between the drain region 6 and the semiconductor layer 5 is forward-biased for discharge. If the static electricity applied to the electrode pad is of positive voltage, the semiconductor layer 5 and the drain region 6 are reverse-biased for breakdown, and then enter a snapback state for discharge. Incidentally, the back gage contact region 8 has a guard-ring function of preventing electrostatic effects from extending to the outside of the guard ring, along with the function of electrically connecting the source electrode 12 to the semiconductor layer 5.

As mentioned above, the negative-voltage static electricity applied to the electrode pad is discharged under the forward bias between the drain region 6 and the semiconductor layer 5. The drain region 6 of rectangular shape, however, receives electric currents of higher densities flowing in from the backgate contact region 8 at the vicinities of both longitudinal ends than at the longitudinal center. This means easy current concentration in the vicinities of the longitudinal ends, facilitating breakdown there. In particular, when the electrode pad is connected to only one of the longitudinal ends of the rectangular drain electrode 11, currents tend to concentrate on that end, producing a problem of especially easy breakdown on the electrode-pad-connected side. While this problem has been described in conjunction with a MOS transistor 100 to be used as the N-channel type MOS transistor 2, the same problem occurs with MOS transistors having the same layout patterns as those of a MOS transistor 100 to be used as the P-channel type MOS transistor 1.

SUMMARY OF THE INVENTION

An object of the present invention is to provide an input protection circuit in which the forward-bias current paths through a PN junction in a MOS transistor constituting the input protection circuit are partially made resistant to current flows so that local current concentration on the PN junction of the MOS transistor, resulting from the application of high voltage to the electrode pad is avoided to improve the breakdown voltage of the input protection circuit.

An input protection circuit according to the present invention comprises: a MOS transistor for discharging a high voltage applied to an electrode pad by means of a forward bias to a PN junction; and a resistance increasing element or device arranged on a part of a current path in the MOS transistor under the forward bias, whereby local current concentration on the PN junction is prevented.

In the present invention, the resistance increasing element or device is arranged on the current path through the MOS transistor's PN junction, in the vicinity of a point where local current concentration tends to occur when the MOS transistor discharges an electric charge induced upon the application of static electricity. This can avoid local current concentration under the forward bias to the PN junction, so that the MOS transistor included in the input protection circuit is prevented from damage.

The MOS transistor preferably includes: a lightly-doped one conductivity type semiconductor layer; a heavily-doped opposite conductivity type drain region having a rectangular pattern, formed in the semiconductor layer; and a heavily-doped one conductivity type backgate contact region formed in the semiconductor layer, patterned like a frame parallel to the rectangular pattern so as to surround the drain region. The resistance increasing element or device preferably include a lightly-doped opposite conductivity type diffusion layer formed between the drain region and the backgate contact region in the semiconductor layer, in the vicinity of a longitudinal end of the drain region at a predetermined distance from the drain region.

Here, the lightly-doped opposite type diffusion layer preferably has a depth greater than those of the drain region and the backgate contact region.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

Figure 4:
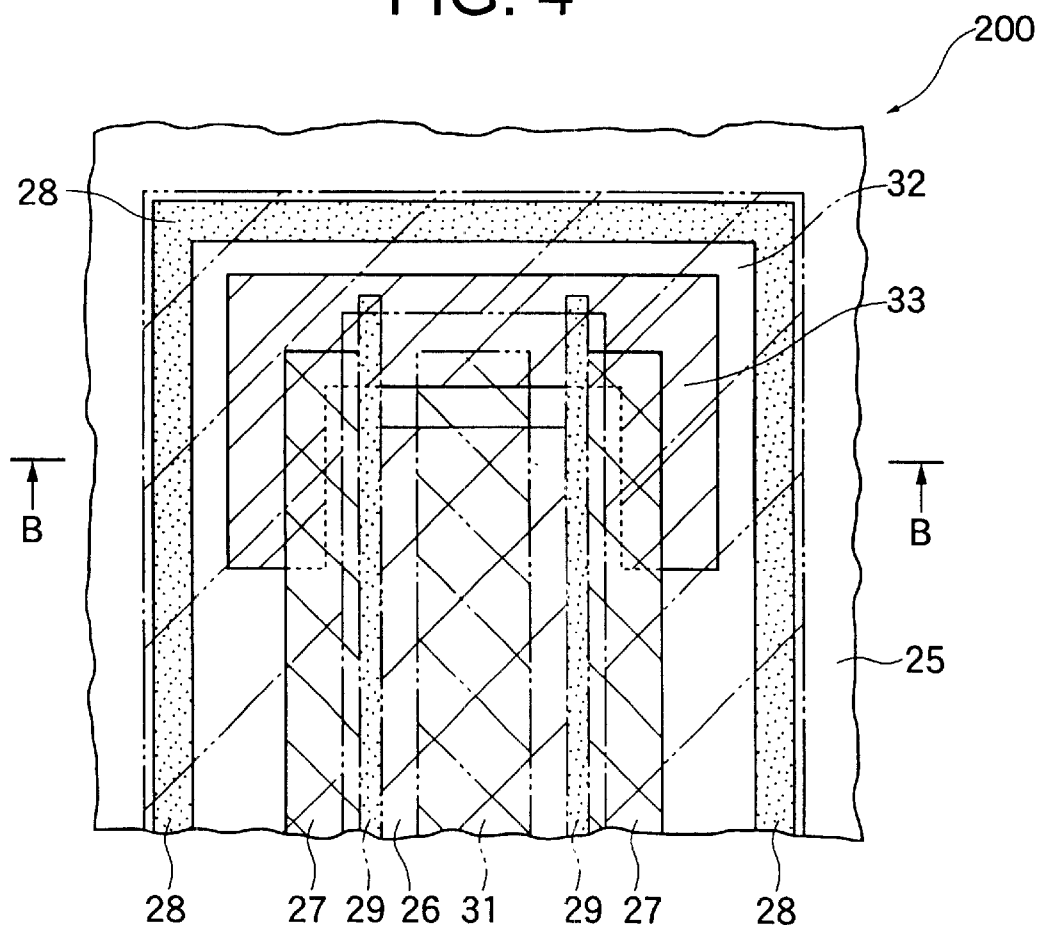
FIG. 4 is a plan view showing the arrangement of source regions, a drain region, and electrodes in a MOS transistor constituting an input protection circuit according to an embodiment of the present invention.
Figure 5:
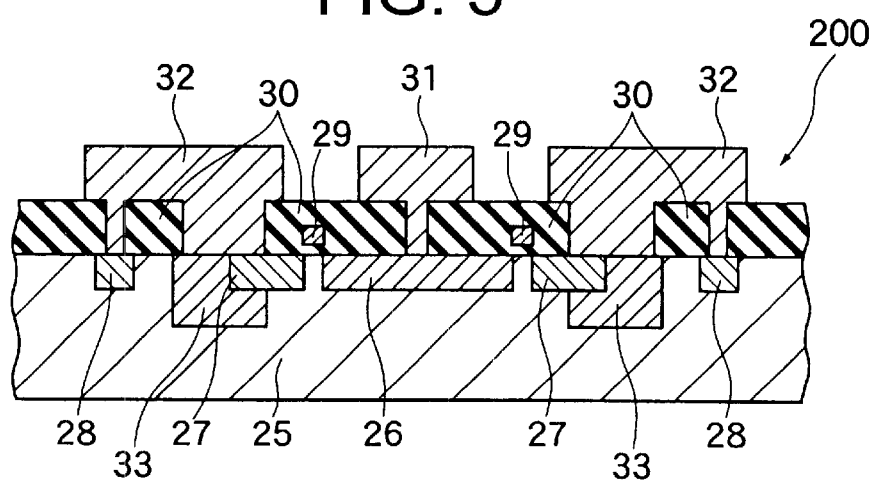
FIG. 5 is a sectional view taken along the line B—B of FIG. 4.

Hereinafter, an input protection circuit according to an embodiment of the present invention will be described in detail with reference to the accompanying drawings. FIG. 4 is a plan view showing the arrangement of source regions, a drain region, and electrodes in a MOS transistor constituting the input protection circuit according to the embodiment of the present invention. FIG. 5 is a sectional view taken along the line B—B of FIG. 4. In FIG. 4, gate electrodes 29, a drain electrode 31, and a source electrode 32 are shown by double-dashed chain lines, and an insulation film 30 is omitted. Besides, the lower part of the MOS transistor is omitted from FIG. 2. The omitted part has the same configuration as that of the shown part, which means general symmetry in the vertical direction. In the present embodiment, description will be made in conjunction with a MOS transistor 200 to be used as the N-channel type MOS transistor 2 in the input protection circuit shown in FIG. 1.

Initially, referring to FIG. 5, description will be given of the sectional structure of the MOS transistor according to the present embodiment. A lightly-doped one conductivity type or P$^-$ type semiconductor layer 25 has a heavily-doped opposite conductivity type or N$^+$ type drain region 26 formed in its surface layer. N$^+$ type source regions 27 are formed on both sides of the drain region 26 at a predetermined distance from the drain region 26. A heavily-doped one conductivity type or P$^+$ type backgate contact region 28 is formed outside the source regions 27 at a predetermined distance from the drain region 26.

Moreover, N$^-$ type diffusion layers 33 having a diffusion depth greater than those of the drain region 26, the source regions 27, and the backgate contact region 28 are formed between the drain region 26 and the backgate contact region 28 at a predetermined distance from each side of the drain region 26. The N$^-$ type diffusion layers 33 are of lightly-doped opposite conductivity type.

The insulation film 30 is formed over the P$^-$ type semiconductor layer 25. This insulation film 30 is provided with contact windows which reach the drain region 26, the source regions 27, the backgate contact region 28, and the N$^-$ type diffusion layers 33. Besides, the gate electrodes 29 are formed over the surface of the semiconductor layer 26 between the drain region 26 and the source regions 27 via the insulation film 30. On the insulation film 30 are formed the drain electrode 31 and the source electrode 32. The drain electrode 31 makes electric contact with the drain region 26 through contact windows in the insulation film 30. The source electrode 32 makes electric contact with the source regions 27, the backgate contact region 28, and the N$^-$ type diffusion layers 33. The drain electrode 31 is connected to an electrode pad (not shown), and the source electrode 32 is connected to a ground terminal GND (not shown). Here, the drain region 26, the source regions 27, the backgate contact region 28, and the N$^-$ type diffusion layers 33 in the surface layer of the semiconductor layer 25 can be formed by making use of the fabrication steps for MOS transistors in a semiconductor integrated circuit to be protected by the input protection circuit. Therefore, no additional step is required.

Now, description will be given of the layout patterns in the MOS transistor 200. As shown in FIG. 4, the drain region 26 is arranged in a rectangular shape in the P$^-$ type semiconductor layer 25. The gate electrodes 29 are arranged in rectangular shapes beside both longer sides of the drain region 26, so as to extend along the longer sides over the semiconductor layer 26 via the insulation film 30. The source regions 27 are arranged in rectangular shapes so as to sandwich the gate electrodes 29 with the drain region 26. Moreover, the backgate contact region 28 is arranged at a predetermined distance from the rectangular drain region 26. The backgate contact region 28 is shaped like a frame which is parallel to each side of the drain region 26, so as to surround the drain region 26, the gate electrodes 29, and the source regions 27. Incidentally, the backgate contact region 28 does not necessarily require continuous corners. Additionally, the N$^-$ type diffusion layers 33 are arranged in the P$^-$ type semiconductor layer 25 between the source regions 27 and the backgate contact region 28. The N$^-$ type diffusion layers 33 are arranged in U shapes at a predetermined distance from the drain region 26 so as to surround both longitudinal ends of the N$^+$ type source regions 27.

The drain electrode 31 is arranged over the drain region 26 across the insulation film 30. The drain electrode 31 makes electric contact with the drain region 26 through contact windows formed through a plurality of points in the insulation film 30. The source electrode 32 is arranged in a frame shape so as to make electric contact, via contact windows formed in the insulation film 30, with the following points: a plurality of points on the source regions 27 and the backgate contact region 28; both longitudinal end portions of the gate electrodes 29; and a plurality of points on the U-shaped N$^-$ type diffusion layers 38.

The drain electrode 31 is connected to the electrode pad at either one or both of its ends. The source electrode 32 is connected to the ground terminal GND. Incidentally, when the drain electrode 31 is connected to the electrode pad at either one of its ends, the N$^-$ type diffusion layers 33 may be arranged on the electrode-pad-connected side alone.

Now, description will be given of the operations of the above-described MOS transistor 200 when used in the input protection circuit shown in FIG. 1. The input protection circuit shown in FIG. 1, when a high voltage resulting from static electricity is applied to the electrode pad 3 while the ground terminal GND is grounded and the power is not yet turned on, discharges the electrostatic charge to the ground terminal GND through the N-channel type MOS transistor 2. As shown in FIGS. 4 and 5, if the static electricity applied to the electrode pad is of negative voltage, the PN junction between the drain region 26 and the semiconductor layer 25 is forward-biased for discharge. Here, the N⁻ type diffusion layers 33 are provided in between the drain region 26 and the backgate contact region 28. Therefore, in the vicinities of the N⁻ type diffusion layers 33, the paths of the currents flowing from the backgate contact region 28 to the drain region 26 become high in resistance because of the N⁻ type diffusion layers 33. This makes it possible to avoid current concentration on the PN junction between the semiconductor layer 25 and the drain region 26 nearby. If the static electricity applied to the electrode pad is of positive voltage, the semiconductor layer 25 and the drain region 26 are reverse-biased for breakdown, and then enter a snapback state for discharge.

Figure 1:
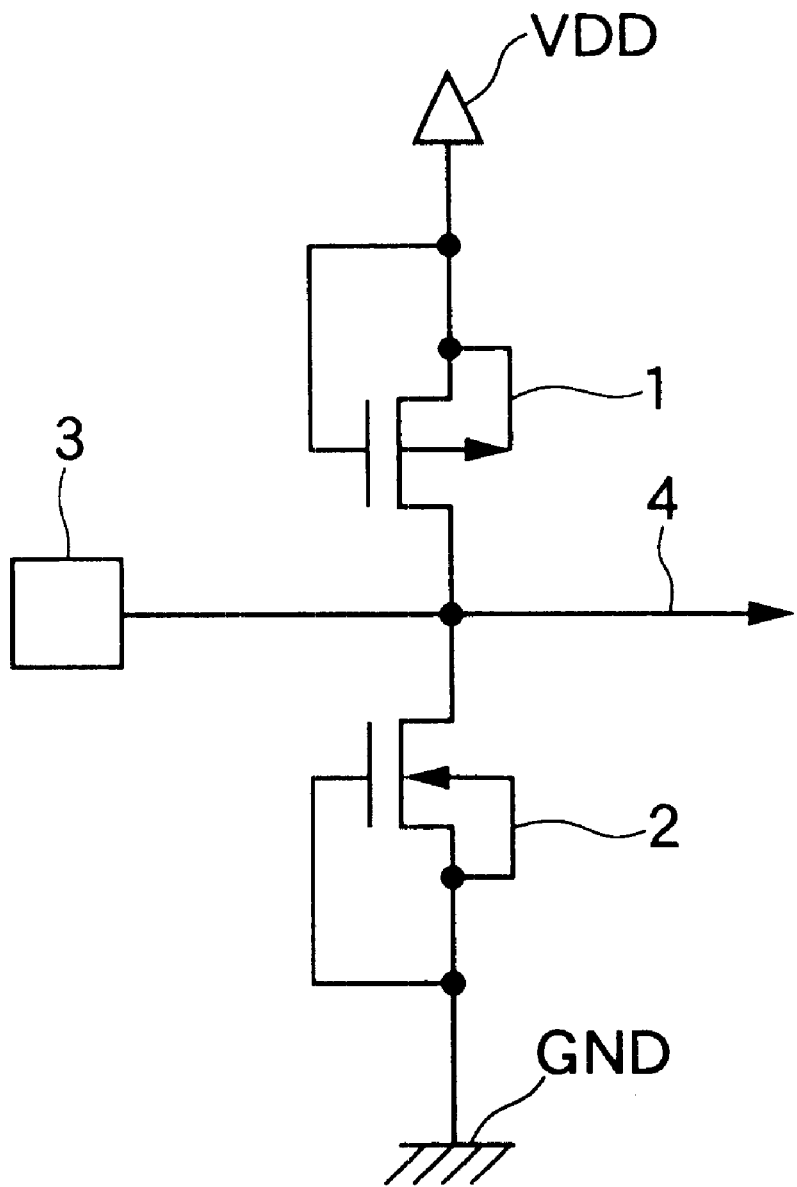
FIG. 1 is a circuit diagram showing an input protection circuit.
Figure 2:
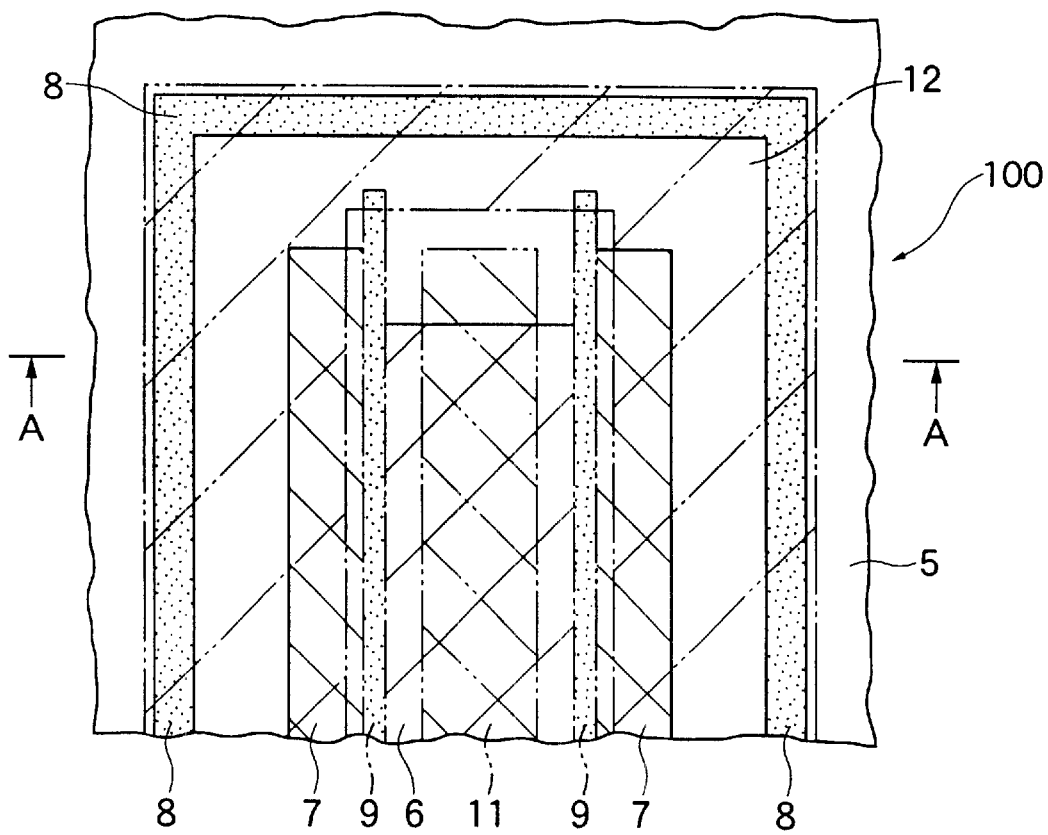
FIG. 2 is a plan view showing the arrangement of source regions, a drain region, and electrodes in a conventional MOS transistor constituting an input protection circuit.
Figure 3:
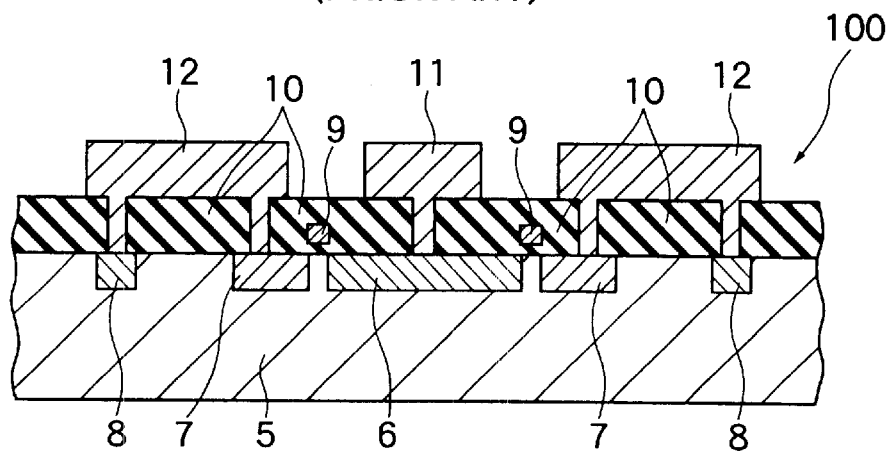
FIG. 3 is a sectional view taken along the line A—A of FIG. 2.

The above-described embodiment has dealt with a MOS transistor to be used as the N-channel type MOS transistor 2 in the input protection circuit shown in FIG. 1, on the assumption that one conductivity type is P type and the opposite conductivity type is N type. However, a MOS transistor to be used as the P-channel type MOS transistor 1 in the input protection circuit shown in FIG. 1 is also possible with N type and P type as one conductivity type and the opposite conductivity type, respectively. In this case, the input protection circuit shown in FIG. 1, when a high voltage resulting from static electricity is applied to the electrode pad 3 while the power supply terminal VDD is grounded, discharges the electrostatic charge to the power supply terminal VDD through the P-channel type MOS transistor 1. If the static electricity applied to the electrode pad is of positive voltage, the PN junction between the drain region and the semiconductor layer is forward-biased for discharge. Here, the P⁻ type diffusion layers are provided in between the drain region and the backgate contact region. Therefore, in the vicinities of the P⁻ type diffusion layers, the paths of the currents flowing from the backgate contact region to the drain region become high in resistance because of the P⁻ type diffusion layers. This makes it possible to avoid current concentration on the PN junction between the semiconductor layer and the drain region in the vicinities of the P⁻ type diffusion layers. If the static electricity applied to the electrode pad is of negative voltage, the semiconductor layer and the drain region are reverse-biased for breakdown, and then enter a snapback state for discharge.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. An input protection circuit comprising:

a MOS transistor for discharging a high voltage applied to an electrode pad by a forward bias to a PN junction;

a resistance increasing element or device arranged on a part of a current path in said MOS transistor under said forward bias, whereby local current concentration on said PN junction is prevented; and wherein said MOS transistor includes:

a lightly-doped one conductivity type semiconductor layer;

a heavily-doped opposite conductivity type drain region having a rectangular pattern, formed in said semiconductor layer;

source regions formed in said semiconductor layer on both sides of and a predetermined distance from said drain region; and a heavily-doped single conductivity type backgate contact region formed in said semiconductor layer, patterned like a frame parallel to said rectangular pattern so as to surround said drain region and said source regions;

wherein said resistance increasing element or device includes a lightly-doped opposite conductivity type diffusion layer formed between said source regions and said backgate contact region in said semiconductor layer, in the vicinity of a first longitudinal end of said drain region at a predetermined distance from said drain region, wherein said diffusion layer forms a first U-shape which extends around first longitudinal ends of said source regions and said first longitudinal end of said drain region.

2. The input protection circuit according to claim 1, wherein said lightly-doped opposite conductivity type diffusion layer has a depth greater than those of said drain region and said backgate contact region.

3. The input protection circuit according to claim 1, wherein said lightly-doped opposite conductivity type diffusion layer has a depth greater than those of said source regions.

* * * * *